(12) United States Patent
Elliott et al.

(10) Patent No.: US 12,546,646 B2
(45) Date of Patent: Feb. 10, 2026

(54) METHOD AND APPARATUS FOR CONTROLLING THE TEMPERATURE OF A SEMICONDUCTOR WAFER

(71) Applicant: METRYX LIMITED, Bristol (GB)

(72) Inventors: Gregor Elliott, Lydney (GB); Eric Tonnis, San Jose, CA (US); Paul Harrison, Gloucester (GB); Mark Berry, Thornbury (GB)

(73) Assignee: METRYX LIMITED, Bristol (GB)

( * ) Notice: Subject to any disclaimer, the term of this patent is extended or adjusted under 35 U.S.C. 154(b) by 1117 days.

(21) Appl. No.: 17/278,736

(22) PCT Filed: Sep. 18, 2019

(86) PCT No.: PCT/EP2019/075051
§ 371 (c)(1),
(2) Date: Mar. 23, 2021

(87) PCT Pub. No.: WO2020/064470
PCT Pub. Date: Apr. 2, 2020

(65) Prior Publication Data
US 2022/0034708 A1    Feb. 3, 2022

(30) Foreign Application Priority Data
Sep. 28, 2018    (GB) ...................................... 1815815

(51) Int. Cl.
*G01G 23/48*    (2006.01)
*G01J 5/00*    (2022.01)
(Continued)

(52) U.S. Cl.
CPC ............ *G01G 23/48* (2013.01); *G01J 5/0007* (2013.01); *G05D 23/1951* (2013.01);
(Continued)

(58) Field of Classification Search
CPC ... G01G 23/48; G01J 5/0007; G05D 23/1951; H01L 21/67109; H01L 21/67248; H01L 21/67253
(Continued)

(56) References Cited

U.S. PATENT DOCUMENTS

| 4,432,635 A | 2/1984 | Mayer |
| 4,453,080 A | 6/1984 | Berkowitz |

(Continued)

FOREIGN PATENT DOCUMENTS

| CN | 106409730 A | 2/2017 |
| JP | H11168056 A | 6/1999 |

(Continued)

OTHER PUBLICATIONS

English translation of JP-2002203814, Jul. 19, 2002. (Year: 2002).*
(Continued)

*Primary Examiner* — Michael P Nghiem

(57) ABSTRACT

A semiconductor wafer mass metrology method comprising: controlling the temperature of a semiconductor wafer by: detecting information relating to the temperature of the semiconductor wafer; and controlling cooling or heating of the semiconductor wafer based on the detected information relating to the temperature of the semiconductor wafer; wherein controlling the cooling or heating of the semiconductor wafer comprises controlling a duration of the cooling or heating of the semiconductor wafer; and subsequently loading the semiconductor wafer onto a measurement area of a semiconductor wafer mass metrology apparatus.

20 Claims, 2 Drawing Sheets

(51) Int. Cl.
*G05D 23/19* (2006.01)
*H01L 21/67* (2006.01)

(52) U.S. Cl.
CPC .. *H01L 21/67109* (2013.01); *H01L 21/67248* (2013.01); *H01L 21/67253* (2013.01)

(58) Field of Classification Search
USPC .......................................................... 702/130
See application file for complete search history.

(56) References Cited

U.S. PATENT DOCUMENTS

| | | | |
|---|---|---|---|
| 6,121,580 | A | 9/2000 | Tsukamoto |
| 2002/0027000 | A1 | 3/2002 | Nishimura |
| 2004/0248430 | A1 | 12/2004 | Barber et al. |
| 2006/0095228 | A1 | 5/2006 | Wilby |
| 2008/0018352 | A1 | 1/2008 | Chiba et al. |
| 2009/0151420 | A1 | 6/2009 | McMasters et al. |
| 2017/0005019 | A1 | 1/2017 | Wilby et al. |
| 2017/0074727 | A1 | 3/2017 | Liu et al. |
| 2019/0214281 | A1* | 7/2019 | Endo .................. H01L 21/6773 |
| 2021/0175102 | A1* | 6/2021 | Elliott ............... H01L 21/67248 |

FOREIGN PATENT DOCUMENTS

| | | | |
|---|---|---|---|
| JP | 2002203814 A | * | 7/2002 |
| JP | 2010540952 A | | 12/2010 |
| JP | 201750747 A | | 3/2017 |
| KR | 10-1999-0082844 A | | 11/1999 |
| KR | 1020070016777 A | | 2/2007 |
| KR | 100803187 B1 | | 2/2008 |
| KR | 100858153 B1 | | 9/2008 |
| KR | 101267670 B1 | | 5/2013 |
| KR | 101401275 B1 | | 5/2014 |
| TW | 200422139 A | | 11/2004 |
| TW | 201723443 A | | 7/2017 |
| TW | 202027196 A | | 7/2020 |
| WO | WO-0203449 A2 | | 1/2002 |
| WO | WO-2015082874 A1 | | 6/2015 |
| WO | WO-2020064470 A1 | | 4/2020 |

OTHER PUBLICATIONS

Korean Office Action for Korean Application No. 10-2021-7012233 dated Oct. 25, 2023.
TW Office Action 108134344 Apr. 24, 2023.
Taiwan Search Report for Application No. 108134344 dated Apr. 24, 2023.
International Search Report and Written Opinion of the ISA issued in PCT/EP2019/075051, mailed Nov. 29, 2019; ISA/EP.
GB Search Report of the Intellectual Property Office issued in Application No. GB1815815.4, dated Mar. 15, 2019.
Official Notice for Korean Application No. 10-2021-7012233 dated Jun. 9, 2022.
Korean Office Action for Korean Application No. 10-2021-7012233 dated Nov. 29, 2022.
Taiwanese Office Action and Search Report for Taiwanese Application No. 108134344 dated May 7, 2024.
Korean Search Report for Korean Application No. KR10-2021-7012233 dated Apr. 7, 2022.

* cited by examiner

METHOD AND APPARATUS FOR CONTROLLING THE TEMPERATURE OF A SEMICONDUCTOR WAFER

CROSS-REFERENCE TO RELATED APPLICATIONS

This application is a U.S. National Phase Application under 35 U.S.C. 371 of International Application No. PCT/EP2019/075051, filed on Sep. 18, 2019, which claims the benefit of Great Britain Patent Application No. GB 1815815.4, filed on Sep. 28, 2018. The entire disclosures of the applications referenced above are incorporated herein by reference.

FIELD OF THE INVENTION

The present invention relates generally to a method of controlling the temperature of a semiconductor wafer and an apparatus for controlling the temperature of a semiconductor wafer.

In some embodiments, the present invention relates to a semiconductor wafer mass metrology method and a semiconductor wafer mass metrology apparatus.

BACKGROUND OF THE INVENTION

Microelectronic devices are fabricated on semiconductor wafers using a variety of techniques, including deposition techniques (CVD, PECVD, PVD, etc.) and removal techniques (e.g. chemical etching, CMP, etc.). Semiconductor wafers may be further treated in other ways that alter their mass, e.g. by cleaning, ion implantation, lithography and the like.

Measuring the change in mass of a wafer either side of a processing step is an attractive method for implementing product wafer metrology. It is relatively low cost, high speed and can accommodate different wafer circuitry patterns automatically. In addition, it can often provide results of higher accuracy than alternative techniques. For example, on many typical materials, thicknesses of material layers can be resolved down to an atomic scale. The wafer in question is weighed before and after the processing step of interest. The change in mass is correlated to the performance of the production equipment and/or the desired properties of the wafer.

Processing steps carried out on semiconductor wafers can cause very small changes in the mass of the semiconductor wafer, which it may be desirable to measure with high accuracy. For example, removing a small amount of material from the surface of the semiconductor wafer may reduce the mass of the semiconductor wafer by a few milligrams, and it may be desirable to measure this change with a resolution of the order of ±100 μg or better.

At these high levels of measurement accuracy, errors in the measurement output caused by temperature variations in the semiconductor wafers being measured or in the temperature of the measurement balance may become significant. For example, a temperature difference of approximately 0.005° C. between the semiconductor wafer and the measurement balance or enclosure may cause an error of approximately 5 μg in the determined mass of the semiconductor wafer. Variations in temperature between different parts of the measurement apparatus (i.e. temperature non-uniformity), e.g. caused by a heat load from semiconductor wafers being measured using the measurement apparatus, will cause errors in the measurement output. In addition, if the semiconductor wafers have a higher temperature than a measurement enclosure of the measurement apparatus, air currents (e.g. convection currents) may be generated in the air in the measurement enclosure, which may affect the measurement output. In addition, the air in the measurement enclosure may be heated, changing its density and pressure and therefore the buoyancy force exerted on the semiconductor wafer by the air. This may also affect the measurement output. The magnitudes of these effects are generally considered insignificant and are ignored (or not detected) in lower accuracy mass measurements, for example measurements performed with a resolution of the order of milligrams.

The temperature of a semiconductor wafer immediately after it has been processed in a production line may be 400-500° C. or higher. After processing the semiconductor wafer may be loaded into a Front Opening Unified Pod (FOUP) together with other recently processed semiconductor wafers (e.g. 25 in total) for transportation between different processing locations of the production line. When the FOUP arrives at a weighing device for weighing the semiconductor wafers, the temperature of the semiconductor wafers may still be high, for example 70° C. or higher. In contrast, the temperature of the weighing device may be approximately 20° C. Therefore, there may be a significant temperature difference between the semiconductor wafers and the weighing device. As discussed above, a significant temperature difference between the semiconductor wafer and the weighing device may cause errors in the weight measurements. For high accuracy weight measurements, even errors caused by very small temperature differences (e.g. less than 1° C., for example 0.001° C.) may be significant.

WO02/03449 describes a semiconductor wafer mass metrology method that aims to reduce errors in the measurement output caused by temperature variations in the measurement balance or of the semiconductor wafers being measured. In the method described in WO02/03449, a semiconductor wafer is removed from a Front Opening Unified Pod (FOUP) and placed on a passive thermal transfer plate that is thermally coupled to a chamber of the semiconductor wafer mass metrology apparatus before it is placed on a measurement area of the semiconductor wafer mass metrology apparatus. The passive thermal transfer plate equalises the temperature of the semiconductor wafer to the temperature of the chamber to within ±0.1° C. This temperature equalisation may reduce the potential errors discussed above when the semiconductor wafer is loaded into the measurement chamber. This method therefore may make the measurement output more accurate, relative to a method in which there is no temperature equalisation of the semiconductor wafer before taking the measurement.

WO2015/082874 described a development of the semiconductor wafer mass metrology method described in WO02/03449, wherein a bulk of the heat load is removed from the semiconductor wafer before using the thermal transfer plate to equalise the temperature of the semiconductor wafer to the temperature of the semiconductor wafer mass metrology apparatus, to reduce the heat load on the semiconductor wafer mass metrology apparatus (which may otherwise cause changes in the temperature of the semiconductor wafer mass metrology apparatus). In an embodiment disclosed in WO2015/082874, the bulk of the heat load is removed from the semiconductor wafers using an active thermal transfer plate and then the temperature of the semiconductor wafers is equalised to the temperature of the measurement chamber using a passive thermal transfer plate that is mounted on an upper surface of the measurement chamber and in thermal equilibrium with the measurement chamber.

SUMMARY OF THE INVENTION

When cooling a semiconductor wafer using a thermal transfer plate, for example an active thermal transfer plate, the semiconductor wafer is placed in contact with the thermal transfer plate, typically by being placed on top of the thermal transfer plate.

Typically, the semiconductor wafer is placed in contact with the thermal transfer plate for a fixed period of time deemed to be sufficient to make sure that all semiconductor wafers having an initial incoming temperature within a predetermined temperature distribution are cooled to substantially the same predetermined temperature. For example, all semiconductor wafers may be placed on an active thermal transfer plate for a fixed period of 40 seconds.

However, this means that cooler semiconductor wafers are placed in contact with the thermal transfer plate for a period of time that is longer than actually necessary to cool the semiconductor wafer to the predetermined temperature. This therefore reduces the throughput of the semiconductor wafer processing, and reduces a productivity of the semiconductor wafer processing. In particular, the step of cooling the semiconductor wafers may be a rate limiting step in the semiconductor wafer processing, such that any increase in time of the cooling of the semiconductor wafers causes a consequential increase in the total time of the semiconductor wafer processing, and therefore a reduced throughput and reduced productivity.

The present inventors have realised that the throughput and productivity of the semiconductor wafer processing may be improved by taking into account the initial incoming temperature of the semiconductor wafer when cooling the semiconductor wafer, for example so that cooler semiconductor wafers are not cooled for as long as hotter semiconductor wafers, or for example so that a semiconductor wafer is not cooled at all if its temperature is already equal to, or within a predetermined range of, a predetermined temperature.

More generally, the same considerations apply to other situations in semiconductor wafer processing where it is necessary to control the temperature of incoming semiconductor wafers to be a predetermined temperature before performing processing of the semiconductor wafer.

At its most general, the present invention therefore provides a method in which cooling or heating of a semiconductor wafer is controlled at least in part based on an incoming temperature of the semiconductor wafer. Such a method can be implemented as part of a semiconductor processing method, such as a semiconductor wafer metrology method.

According to a first aspect of the present invention, there is provided a method of controlling the temperature of a semiconductor wafer, the method comprising:

detecting information relating to the temperature of the semiconductor wafer; and controlling cooling or heating of the semiconductor wafer based on the detected information relating to the temperature of the semiconductor wafer.

In the first aspect of the present invention, the cooling or heating of the semiconductor wafer is controlled based on information relating to the temperature of the semiconductor wafer. This means that the temperature of the semiconductor wafer is taken into account when performing the cooling or heating of the semiconductor wafer, such that cooler semiconductor wafers can be cooled or heated differently to hotter semiconductor wafers. Thus, the cooling or heating of the semiconductor wafer can be optimised for the temperature of the semiconductor wafer, so that the throughput and productivity can be improved. Controlling the cooling or heating of a semiconductor wafer may comprise deciding not to cool or heat the semiconductor wafer, for example where the temperature of the semiconductor wafer is already equal to, or within a predetermined range of, a desired temperature. In other words, controlling the cooling or heating of the semiconductor wafer may comprise setting a duration of the cooling or heating of the semiconductor wafer to zero, so that cooling or heating of the semiconductor wafer is not performed.

The first aspect of the present invention may optionally have any one, or, where compatible, any combination of the following optional features.

Typically, the temperature of the semiconductor wafer is an incoming temperature of the semiconductor wafer, for example a temperature of the semiconductor wafer soon, or (immediately) before the cooling or heating of the semiconductor wafer will be started if cooling or heating of the semiconductor wafer is performed. For example, the temperature of the semiconductor wafer may be measured less than 1 minute, or less than 30 seconds, or less than 10 second before the cooling or hearing of the semiconductor wafer will be started if cooling or heating of the semiconductor wafer is performed.

Typically, the temperature of the semiconductor wafer is measured less than three seconds before the cooling or heating of the semiconductor wafer will be started, if cooling or heating of the semiconductor wafer is to be performed, for example less than three seconds before the wafer will be placed on a thermal transfer plate. Then, the measured temperature accurately corresponds to the temperature of the semiconductor wafer when the cooling or heating of the semiconductor wafer will be started, if cooling or heating of the semiconductor wafer is performed.

The information relating to the temperature of the semiconductor wafer may be the actual temperature of the semiconductor wafer. Alternatively, the information may be information that is indicative of, or representative of, or proportional to, the actual temperature of the semiconductor wafer, for example an amount of infrared (IR) radiation emitted by the semiconductor wafer.

Detecting the information relating to the temperature of the semiconductor wafer typically means measuring the information relating to the temperature of the semiconductor wafer, for example measuring an amount of IR radiation emitted by the semiconductor wafer.

The information relating to the temperature of the semiconductor wafer may be detected using a non-contact measurement method.

For example, detecting the information relating to the temperature of the semiconductor wafer may comprise detecting radiation emitted by the semiconductor wafer, for example IR radiation. Typically, the method will involve measuring the amount of the radiation emitted by the semiconductor wafer. Since the amount of IR radiation emitted by the semiconductor wafer depends on the temperature of the semiconductor wafer, the amount of IR radiation emitted by the semiconductor wafer indicates the temperature of the semiconductor wafer.

Of course, the information relating to the temperature of the semiconductor wafer may be measured in a different way.

For example, the information relating to the temperature of the semiconductor wafer may instead be measured using a contact method, for example by bringing a temperature sensor into contact with the semiconductor wafer.

In some examples, measuring information relating to the temperature of the semiconductor wafer may comprise measuring information relating to the temperature of something in thermal contact with the semiconductor wafer, for example an end effector of a robotic arm that is used to transport the semiconductor wafer. This information may be obtained using a non-contact method, such as by measuring an amount of infrared radiation.

In some examples, a non-contact temperature measuring device may be embedded in a robotic arm or an end effector of a robotic arm that is used to transport the semiconductor wafer.

In some examples, the non-contact measurements may be performed using a thermographic camera.

Of course, a combination or more than one method of obtaining the information relating to the temperature of the semiconductor wafer may be used in the present invention, for example a combination of a contact method and a non-contact method.

The cooling or heating of the semiconductor wafer may be controlled in a way that depends uniquely on the temperature of the semiconductor wafer, so that a different control of cooling or heating is performed for each different temperature of the semiconductor wafer.

Alternatively, the method may comprise comparing the detected information relating to the temperature of the semiconductor wafer with one or more threshold values, and controlling the cooling or heating of the semiconductor wafer based on the result of the comparison.

For example, semiconductor wafers having a temperature greater than (or greater than or equal to) a threshold value may have their cooling or heating controlled in a first manner, whereas semiconductor wafers having a temperature less than (or less than or equal to) the threshold value may have their cooling or heating controlled in a second manner.

Essentially, therefore, the semiconductor wafers may be categorised into either a "cold" or "hot" category, and the heating or cooling of the semiconductor wafers may then be controlled based on this categorisation. For example, when controlling cooling of the semiconductor wafers, wafers in the "cold" category may be cooled for a shorter period of time than wafers in the "hot" category, or wafers in the "cold" category may not be cooled at all, i.e. cooling of the "cold" category wafers may be skipped, whereas cooling is performed for wafers in the "hot" category.

More generally, the semiconductor wafers may be categorised as being "ambient" or "non-ambient".

For example, the method may comprise: comparing the detected information relating to the temperature of the semiconductor wafer with a threshold value; based on the result of the comparison, categorising the semiconductor wafer into one of a plurality of categories; and controlling the cooling or heating of the semiconductor wafer based on the result of the categorisation.

The amount of infrared radiation emitted from a semiconductor wafer may be significantly influenced by any coating on the semiconductor wafer. In particular, silicon is essentially transparent for infrared wavelengths, whereas coatings typically applied to semiconductor wafers are typically not transparent for infrared wavelengths, and instead typically have different degrees of infrared emissivity. The threshold value may therefore be determined taking into account the specific configuration of the semiconductor wafer being measured, for example any surface coatings of the semiconductor wafer.

Such a threshold value can be determined experimentally by measuring IR signals from a semiconductor wafer having a particular configuration (e.g. particular surface coating(s)) for different temperatures of the semiconductor wafer. Alternatively, such a threshold value may be calculated based on theory.

More generally, the threshold value may be predetermined based on the infrared emissivities of a plurality of coatings that are typically used on semiconductor wafers, for example based on an average value, or based on a minimum or maximum value.

The number of the categories could be two, as in the "cold" or "hot" categories example discussed above, or could be more than two. In practice, the number of possible categories can be any number.

Typically, each of the categories will uniquely correspond to a particular way of controlling the heating or cooling of the semiconductor wafers, so that semiconductor wafers in different categories are cooled or heated differently to each other. Controlling the cooling or heating of the semiconductor wafer may comprise controlling a duration of the cooling or heating of the semiconductor wafer. Where the semiconductor wafer has a temperature equal to a desired temperature, for example an ambient temperature or a temperature of a measurement chamber, the amount or cooling or heating of the semiconductor wafer may be controlled to be zero, so that no heating or cooling of the semiconductor wafer is performed. Therefore, a duration of the cooling or heating of the semiconductor wafer may be controlled to be zero.

Controlling the cooling or heating of the semiconductor wafer may comprise skipping an available cooling or heating step if a temperature difference between a measured temperature of the semiconductor wafer and a predetermined temperature, for example a temperature of the measurement area, for example a temperature of a measurement chamber, is less than $\pm 2K$, or $\pm 1K$, or $\pm 0.5K$, or $\pm 0.1K$.

For example, this may comprise controlling a duration that the semiconductor wafer is in contact with a heating or cooling part, such as a thermal transfer plate.

Alternatively, or in addition, this may comprise controlling a duration for which power is supplied to a powered heating or cooling part used to heat or cool the semiconductor wafer, for example a resistive heater or a Peltier device.

For example, when cooling a semiconductor wafer, cooler wafers can be cooled for a shorter duration than hotter wafers. Conversely, when heating a semiconductor wafer, hotter wafers can be heated for a shorter duration than cooler wafers. Thus, the throughput and productivity can be improved. Alternatively, cooling or heating of the semiconductor wafer may be skipped, so that no cooling or heating is performed, where the temperature of the semiconductor wafer is equal to, or within a predetermined range of, a desired temperature.

Alternatively, or in addition, controlling the cooling or heating of the semiconductor wafer may comprise controlling a rate of the cooling or heating of the semiconductor wafer. Where the temperature of the semiconductor wafer is equal to, or within a predetermined range of, a desired temperature, the rate of the cooling or heating may be controlled to be zero, so that no cooling or heating is performed.

The rate of the cooling or heating refers to the temperature change divided by the time over which the temperature change occurs. A higher rate of the cooling or heating therefore corresponds to a more rapid temperature change.

For example, when cooling semiconductor wafers, hotter wafers can be cooled at a faster rate than cooler wafers, to reduce the time taken to cool the hotter wafers. Conversely, when heating semiconductor wafers, cooler wafers can be heated at a faster rate than hotter wafers, to reduce the time taken to heat the cooler wafers. Thus, the throughput and productivity can be improved.

The semiconductor wafer may be cooled using a passive cooling or heating device, for example a passive thermal transfer plate, or an active cooling or heating device, for example an active thermal transfer plate.

In this context, "passive" means that the cooling or heating device is neither cooled nor heated by cooling/heating elements, but rather receives its temperature by the surrounding ambient environment only.

A passive thermal transfer plate is typically a plate or block of material having a high thermal mass and/or high thermal conductivity.

For example, a passive thermal transfer plate may be a plate or block of metal, such as aluminium.

Where the heating or cooling is performed using a passive thermal transfer plate, the passive thermal transfer plate may be substantially in thermal equilibrium with a processing chamber in which the semiconductor wafer will subsequently be processed, for example a measurement chamber of a metrology apparatus (thermal equilibrium may mean that the temperature difference is not more than 0.1° C.). For example, the passive thermal transfer plate may be attached to an outer surface of the processing/measurement chamber, for example using bolts having a high thermal conductivity.

Conversely, "active" means that the cooling or heating device is heated or cooled by a powered heating or cooling device.

For example, the semiconductor wafers may be cooled using a Peltier device, or heated using a resistive heating device.

Heating of a semiconductor wafer may alternatively be achieved using an electrical heater, for example.

Cooling of a semiconductor wafer may alternatively be achieved using a refrigeration system, or a water cooling system, for example.

However, typically using a thermal transfer plate allows for more accurate cooling or heating of the semiconductor wafer.

An active thermal transfer plate may comprise a plate or block of material having a high thermal mass and/or high thermal conductivity that is heated or cooled by one or more powered cooling or heating devices. For example, the plate or block of material may be a plate or block of metal, such as aluminium.

Controlling the cooling or heating of the semiconductor wafer may comprise controlling a power of the powered cooling or heating device. Increasing the power of the powered cooling or heating device typically corresponds to increasing a rate of cooling or heating of the semiconductor wafer provided by the cooling or heating device, whereas decreasing the power of the powered cooling or heating device typically corresponds to decreasing a rate of cooling or heating of the semiconductor wafer provided by the cooling or heating device. Controlling the power of the powered cooling or heating device may comprise controlling electrical power supplied to, or used by, the powered cooling or heating device. Where the temperature of the semiconductor wafer is equal to, or within a predetermined range of, a desired temperature, the power of the powered cooling or heating device may be controlled to be zero.

The method of controlling the temperature of the semiconductor wafer according to the first aspect of the present invention may be part of a semiconductor wafer processing method, in which the semiconductor wafer is processed.

Therefore, according to the present invention there may be provided a semiconductor wafer processing method that comprises: controlling the temperature of a semiconductor wafer using the method of the first aspect of the present invention; and subsequently loading the semiconductor wafer onto a processing area of a semiconductor wafer processing apparatus.

In such a processing method, the temperature of the semiconductor wafer may be controlled to be substantially equal to a predetermined processing temperature, which is a desired temperature of the semiconductor wafer at which to perform the processing of the semiconductor wafer. This may be achieved using passive or active cooling as discussed above, such as by using a passive or an active thermal transfer plate as discussed above.

Alternatively, the temperature of the semiconductor wafer may be firstly controlled to be a temperature that is within ±2K, or ±1K, or ±0.5K, or ±0.1K, of the predetermined processing temperature, and the method may then further comprise a further step of cooling or heating the semiconductor wafer to be substantially equal to the predetermined processing temperature. Thus, the cooling or heating of the semiconductor wafer to the predetermined processing temperature may be a two-step cooling or heating process.

For example, the method according to the first aspect of the present invention may comprise controlling cooling or heating of the semiconductor wafer using an active cooling part, and then subsequently cooling or heating the semiconductor wafer using a passive cooling part, such as a passive cooling part that is substantially in thermal equilibrium with a processing chamber in which the semiconductor wafer is to be processed (for example a passive thermal transfer plate as discussed above).

Where the incoming temperature of the semiconductor wafer is equal to, or within a predetermined range of, the predetermined processing temperature, cooling or heating of the semiconductor wafer using the active cooling part may be skipped, and the semiconductor wafer may instead be cooled or heated using only the passive cooling part. This may significantly increase throughput of the semiconductor wafers.

The processing method may be a metrology method, for example a mass metrology method.

In a specific example, the processing method may be a semiconductor wafer mass metrology method that comprises controlling the temperature of a semiconductor wafer using the method of the first aspect of the present invention; and subsequently loading the semiconductor wafer onto a measurement area of a semiconductor wafer mass metrology apparatus.

In such a mass metrology method the temperature of the semiconductor wafer is typically controlled to be equal to a temperature of a measurement area of a semiconductor wafer mass metrology apparatus using either a one-step heating or cooling process or a two-step cooling or heating process as discussed above. The method of the first aspect of the present invention may be applied to either, or both, of the two-steps of the two-step cooling process.

The measurement area may be inside a measurement chamber; and the temperature of the semiconductor wafer may be controlled to be substantially equal to the temperature of the measurement chamber, or within ±2K, or ±1K, or ±0.5K, or ±0.1K, of the temperature of the measurement chamber.

According to a second aspect of the present invention there is provided an apparatus for controlling the temperature of a semiconductor wafer, the apparatus comprising:

a cooling or heating part for cooling or heating the semiconductor wafer; and a controller configured to control cooling or heating of the semiconductor wafer by the cooling or heating part based on detected information relating to the temperature of the semiconductor wafer.

Where compatible, the second aspect of the present invention may include any of the features of the first aspect of the present invention discussed above.

Where these features relate to method steps, the controller may be configured to control the apparatus to perform the method steps.

In addition, or alternatively, the second aspect of the present invention may include any one, or, where compatible, any combination of the following optional features.

The controller may be configured to: compare the detected information relating to the temperature of the semiconductor wafer with a threshold value; and control the cooling or heating of the semiconductor wafer based on the result of the comparison.

The controller may be configured to: compare the detected information relating to the temperature of the semiconductor wafer with a threshold value; based on the result of the comparison, categorise the semiconductor wafer into one of a plurality of categories; and control the cooling or heating of the semiconductor wafer based on the result of the categorisation.

The controller may be configured to control a duration of cooling or heating of the semiconductor wafer. Controlling a duration of cooling or heating of the semiconductor wafer may include deciding not to perform cooling or heating of the semiconductor wafer, such that the duration of cooling or heating of the semiconductor wafer is zero.

For example, where the cooling or heating part is a powered cooling or heating part, controlling the duration of the cooling or heating of the semiconductor wafer may comprise controlling a duration in which power is supplied to the cooling or heating part.

For example, the controller may be configured to control a rate of cooling or heating of the cooling or heating part. Controlling a rate of cooling or heating of the semiconductor wafer may include deciding not to perform cooling or heating of the semiconductor wafer, such that the rate of cooling or heating of the semiconductor wafer is zero.

Alternatively, controlling the duration of the cooling or heating of the semiconductor wafer may comprise controlling a duration of time that the semiconductor wafer is in contact with the cooling or heating part.

For example, the apparatus may comprise one or more transport parts (for example one or more robot arms with one or more end effectors) for loading/unloading the semiconductor wafer onto/off of the cooling or heating part, and the controller may control the loading/unloading times of the semiconductor wafer so that the semiconductor wafer is loaded onto the cooling or heating part for the required duration.

The cooling or heating part may comprise a powered cooling or heating device.

The controller may be configured to control a power of the powered cooling or heating device.

As discussed above, the cooling or heating part may be a passive thermal transfer plate or an active thermal transfer plate.

The apparatus may comprise a detector configured to detect the information relating to the temperature of the semiconductor wafer, for example by measuring an amount of radiation emitted by the semiconductor wafer.

The detector may be configured to detect the information relating to the temperature of the semiconductor wafer before the semiconductor wafer is loaded on the cooling or heating part. This is advantageous, because if the temperature of the semiconductor wafer is already within a predetermined range of a predetermined temperature, it may be decided to not perform cooling or heating of the semiconductor wafer, in which case the semiconductor wafer is then not loaded onto the cooling or heating part.

Alternatively, the detector may be configured to detect the information relating to the temperature of the semiconductor wafer when, or while, the semiconductor wafer is loaded on the cooling or heating part.

However, the detector may be provided separately to the apparatus, in which case the present invention may instead provide a system comprising the apparatus according to the second aspect of the present invention, and a detector configured to detect the information relating to the temperature of the semiconductor wafer.

The detector may comprise an infrared detector for detecting infrared radiation from the semiconductor wafer. Typically the amount of infrared radiation emitted by the semiconductor wafer will be measured and used to give a qualitative (by comparison with other measured values) or quantitative (by calculation) indication of the temperature of the semiconductor wafer.

The apparatus may be a semiconductor wafer processing apparatus that further comprises a processing area where the semiconductor wafer can be processed to measure or change one or more characteristic of the semiconductor wafer.

The apparatus may be a semiconductor wafer mass metrology apparatus that further comprises a measurement area where the weight and/or mass of the semiconductor wafer, or a change in weight and/or mass of the semiconductor wafer can be determined.

BRIEF DESCRIPTION OF THE DRAWINGS

Embodiments of the present invention will now be discussed, by way of example only, with reference to the accompanying Figures, in which.

DETAILED DESCRIPTION OF THE PREFERRED EMBODIMENTS AND FURTHER OPTIONAL FEATURES OF THE INVENTION

Figure 1:
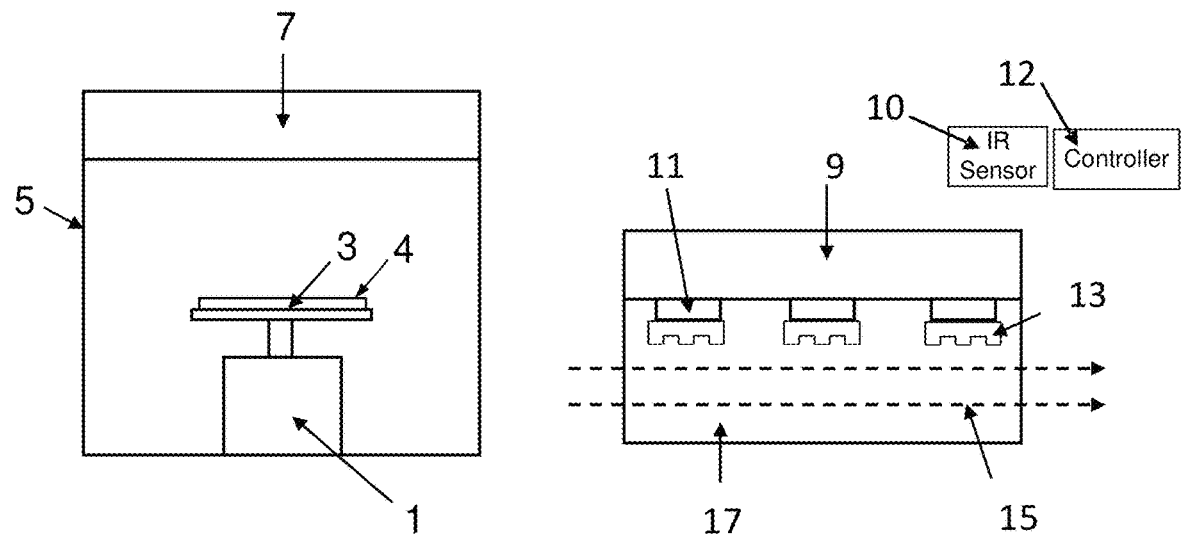
FIG. 1 shows a semiconductor wafer mass metrology apparatus according to a first embodiment of the present invention.

FIG. 1 shows a semiconductor wafer mass metrology apparatus according to a first embodiment of the present invention. The semiconductor wafer mass metrology apparatus comprises a weighing balance 1 having a weighing pan 3 for receiving a semiconductor wafer 4. The weighing balance 1 is configured to provide measurement output indicative of the weight of a semiconductor wafer loaded on the weighing pan 3.

The weighing balance 1 is located within a weighing chamber 5, which forms an enclosed environment around the weighing balance 1, e.g. to maintain a substantially uniform air density, air pressure and air temperature of the air around the weighing balance and to prevent draughts and provide electromagnetic shielding. The weighing chamber 5 has an opening (not shown), e.g. a suitably sized slot in a side-wall of the weighing chamber 5, to allow a semiconductor wafer to be transported into the weighing chamber 5, e.g. by a robotic arm, and positioned on the weighing pan 3. When not in use, the opening may be covered by an openable door or covering (not shown) to allow the weighing chamber 5 to be substantially closed or sealed when performing measurements using the weighing balance 1.

A passive thermal transfer plate 7 is positioned on top of the weighing chamber 5. The passive thermal transfer plate 7 comprises a block of material having a good thermal conductivity (for example Al). The passive thermal transfer plate also preferably has a high thermal mass, so that its temperature changes slowly and little when it is supplied with heat, and a good lateral thermal conductivity, so that it maintains a substantially uniform temperature across its upper surface. In this embodiment, the passive thermal transfer plate 7 is made from aluminium, but in other embodiments any other material with a good thermal conductivity may be used.

The passive thermal transfer plate 7 is positioned directly on top of the weighing chamber 5, so that there is a good thermal contact between the passive thermal transfer plate 7 and the weighing chamber 5. The passive thermal transfer plate 7 is in direct physical contact with the weighing chamber 5. The passive thermal transfer plate 7 may be attached or fixed to the weighing chamber 5, for example using one or more bolts (not shown) and/or a thermally conductive bonding layer (not shown).

As a result of the good thermal contact between the passive thermal transfer plate 7 and the weighing chamber 5, the passive thermal transfer plate 7 may be substantially in thermal equilibrium with the weighing chamber 5 and therefore may have substantially the same temperature as the weighing chamber 5. The weighing balance 1 may also be in thermal equilibrium with the weighing chamber 5 and therefore may also have substantially the same temperature as the weighing chamber 5. As such, the passive thermal transfer plate 7 may be substantially in thermal equilibrium with the weighing balance 1 and therefore may have substantially the same temperature as the weighing balance 1.

The weighing balance 1 and the weighing pan 3 may be considered as comprising a measurement area of the semiconductor wafer mass metrology apparatus. Alternatively, the weighing chamber 5 may be considered as comprising a measurement area of the semiconductor wafer mass metrology apparatus.

The semiconductor wafer mass metrology apparatus of FIG. 1 further comprises an active thermal transfer plate 9, an IR sensor 10, and a controller 12, which are discussed in more detail below.

A plurality of Peltier devices 11 are attached to a bottom side of the active thermal transfer plate 9. Each Peltier device 11 has a heat sink 13 attached to the bottom side thereof. An air flow 15 can be provided in a region 17 beneath the bottom side of the thermal transfer plate 9 in order to remove heat from the Peltier devices 11 and from the heat-sinks 13. Of course, the configuration of the air flow may be different to that shown in FIG. 1, for example, air may be blown out of the bottom of the region 17 by a fan.

In FIG. 1 the active thermal transfer plate 9 is shown as being positioned to the right-hand side of the weighing chamber 5. However, in other embodiments the active thermal transfer plate 9 can be positioned differently, for example to a different side, above or below the weighing chamber 5, or closer or further away from the weighing chamber 5 than illustrated in FIG. 1. In other embodiments, the active thermal transfer plate 9 may be attached or connected, directly or indirectly, to the passive thermal transfer plate 7.

In use, a wafer transporter, for example an end effector of a robotic arm of a EFEM, is used to remove a semiconductor wafer from a FOUP (not shown), or alternatively from another processing apparatus (not shown), and to transport the semiconductor wafer to the active thermal transfer plate 9 and position the semiconductor wafer on the active thermal transfer plate 9. When the semiconductor wafer is removed from the FOUP (or the other processing apparatus) it may have a temperature of approximately 70° C. For example, the semiconductor wafer may have been processed at a processing station of a semiconductor device production line, which may have heated the semiconductor wafer to a temperature of 400 to 500° C., before the semiconductor wafer was loaded into the FOUP.

When the semiconductor wafer is positioned on the active thermal transfer plate 9, heat is conducted from the semiconductor wafer to the active thermal transfer plate 9 so that the temperature of the semiconductor wafer is decreased. Typically the semiconductor wafer is positioned on the active thermal transfer plate 9 for a sufficiently long period of time for the semiconductor wafer and the active thermal transfer plate 9 to achieve thermal equilibrium (e.g. so that they have substantially the same temperature). As discussed below, in this embodiment the cooling of the semiconductor wafer by the active thermal transfer plate 9 is controlled by the controller 12 based on an incoming temperature of the semiconductor wafer measured by the IR sensor 10. As discussed below, in some cases the cooling of the semiconductor wafer by the active thermal transfer plate 9 may not be performed, in which case the semiconductor wafer may not be positioned on the active thermal transfer plate 9.

Transfer of heat from the semiconductor wafer to the active thermal transfer plate 9 would act to increase the temperature of the active thermal transfer plate 9. In that case, the thermal equilibrium temperature of the semiconductor wafer and the active thermal transfer plate 9 may be different to a desired temperature of the semiconductor wafer. In order to prevent the temperature of the active thermal transfer plate 9 from increasing due to the heat load from the semiconductor wafer, the active thermal transfer plate 9 is operable to actively dissipate the heat load removed from the semiconductor wafer. In particular, the Peltier devices 11 are operated to actively remove heat from the active thermal transfer plate 9. In other words, electrical power is supplied to the Peltier devices 11 to cause them to act as active heat pumps that transfer heat from their upper surfaces in contact with the active thermal transfer plate 9 to their lower surfaces to which the heat-sinks 13 are attached.

An air-flow 15 is provided in the region 17 beneath the active thermal transfer plate 9 in which the Peltier devices 11 and the heat-sinks 13 are positioned in order to remove heat from the Peltier devices 11 and the heat-sinks 13. The heat removed from the semiconductor wafer using the active thermal transfer plate 9 is therefore transported and dissipated away from the weighing chamber 5 of the semiconductor wafer mass metrology apparatus by the air-flow 15, so that this heat has no effect on the temperature of the semiconductor wafer mass metrology apparatus. The air-flow 15 may be generated by one or more fans, for example posited in, or at the edges of, the region 17. In other words, heat is actively dissipated from the active thermal transfer plate 9.

As mentioned above, actively dissipating heat from the active thermal transfer plate 9 will prevent heat from building up in the active thermal transfer plate 9, which would cause an increase in the temperature of the thermal transfer plate 9. In this embodiment, the heat removed from the semiconductor wafer is effectively/efficiently disposed of by being dissipated by the active thermal transfer plate 9. This may enable the temperature of the semiconductor wafer to be more precisely/accurately controlled using the thermal transfer plate 9.

The active thermal transfer plate 9 is operated to remove a bulk of a heat load from the semiconductor wafer, so that the temperature of the semiconductor wafer is reduced to close to the desired temperature of the semiconductor wafer when it is positioned on the weighing pan 3. The active thermal transfer plate 9 may remove over 90%, or over 95%, of the heat that needs to be removed to reduce the temperature of the semiconductor wafer to the desired temperature. Put another way, the active thermal transfer plate 9 may cause over 90%, or over 95%, of the temperature change required to decrease the temperature of the semiconductor wafer from its initial temperature to the desired temperature when it is positioned on the weighing pan 3.

In this embodiment, it is desired to substantially match the temperature of the semiconductor wafer to the temperature of the weighing chamber 5, so that there is substantially no temperature difference between the semiconductor wafer and the weighing chamber 5 (and therefore substantially no temperature difference between the semiconductor wafer and the weighing balance 1) when the semiconductor wafer is loaded on the weighing pan 3. In this embodiment, the active thermal transfer plate 9 may cool the semiconductor wafer to within ±1° C. of the temperature of weighing chamber 5. For example, where the weighing chamber has a temperature of 20° C., the active thermal transfer plate 9 may cool the semiconductor wafer to a temperature of (20±1°) C. However, in other embodiments the amount of cooling provided by the active thermal transfer plate 9 may be different to this, provided that as a minimum the active thermal transfer plate 9 provides over 50% of the required temperature change of the semiconductor wafer, and preferably over 80%.

Once the semiconductor wafer has been cooled to a temperature close to the desired temperature using the active thermal transfer plate 9, it is transported to the passive thermal transfer plate 7 using a wafer transporter.

However, as mentioned above, where the temperature of the semiconductor wafer is within a predetermined range of the desired temperature, for example the temperature of the weighing chamber 5, before the semiconductor wafer is cooled using the active thermal transfer plate 9, it may be decided to skip cooling of the semiconductor wafer using the active thermal transfer plate 9, and instead the semiconductor wafer may be transported to the passive thermal transfer plate 7 without first being cooled by the active thermal transfer plate 9.

As discussed above, when the semiconductor wafer is positioned on the passive thermal transfer plate 7 there is good thermal contact between the semiconductor wafer and the passive thermal transfer plate 7. Therefore, the semiconductor wafer is cooled by heat being conducted from the semiconductor wafer to the passive thermal transfer plate 7. Typically the semiconductor wafer is positioned on the passive thermal transfer plate 7 for a sufficient period of time for the passive thermal transfer plate 7 and the semiconductor wafer to become substantially in thermal equilibrium, so that they have substantially the same temperature (i.e. the temperature of the semiconductor wafer is matched or equalised to the temperature of the passive thermal transfer plate 7 and therefore to the temperature of the weighing chamber 5). For example, the semiconductor wafer may be positioned on the thermal transfer plate 7 for a period of up to 60 seconds.

The semiconductor wafer has already had the bulk of its heat load removed by the active thermal transfer plate 9 before it is positioned on the passive thermal transfer plate 7 (unless cooling using the active thermal transfer plate 9 has been skipped because the temperature of the semiconductor wafer was within a predetermined range of the desired temperature). Therefore, the thermal load on the passive thermal transfer plate 7 during the temperature equalisation is very low, and the temperature of the passive thermal transfer plate 7 and the weighing chamber 5 (which have a high thermal mass) therefore remains substantially constant during the temperature equalisation. In addition, relatively little heat has to be exchanged to bring the semiconductor wafer into thermal equilibrium with the passive thermal transfer plate 7.

When the temperature of the semiconductor wafer is substantially equalised to the temperature of the weighing chamber 5 (e.g. when the semiconductor wafer has been on the thermal transfer plate 7 for a predetermined period of time) the semiconductor wafer is transported by a wafer transporter from the thermal transfer plate 7 to the weighing pan 3. The weighing balance 1 is then used to provide measurement output indicative of the weight of the semiconductor wafer. Because the temperature of the semiconductor wafer has been substantially matched to the temperature of the weighing chamber, and without significantly changing the temperature of the weighing chamber (as the heat load on the weighing chamber is very small), any temperature errors in the measurement output may be substantially zero. For example, there may be no significant convection currents generated in the weighing chamber 5, no significant changes in the buoyancy force on the semiconductor wafer (which would be caused by heating of the air in the weighing chamber 5), and no significant temperature changes (e.g. temperature increase or temperature non-uniformity) in the weighing balance 1 due to the presence of the semiconductor wafer on the weighing pan 3.

As mentioned above, the semiconductor wafer mass metrology apparatus of the present embodiment includes an IR sensor 10 and a controller 12. The IR sensor 10 and controller 12 are illustrated schematically in the figures, and of course their configuration and positioning in practice will be different to that illustrated in the figures.

The IR sensor 10 is arranged to measure infrared (IR) radiation emitted by the semiconductor wafer before the semiconductor wafer is positioned on the active thermal transfer plate 9. The measured IR radiation emitted by the semiconductor wafer indicates the incoming temperature of the semiconductor wafer, before it is positioned on the active thermal transfer plate 9.

As mentioned above, typically the semiconductor wafer is positioned on the active thermal transfer plate 9 for a sufficiently long period of time for the semiconductor wafer and the active thermal transfer plate 9 to achieve thermal equilibrium (e.g. so that they have substantially the same temperature). In the past this was achieved by positioned all semiconductor wafers on the active thermal transfer plate 9 for the same period of time, e.g. 40 seconds. However, the present inventors have realised that this means that some cooler semiconductor wafers are positioned on the active thermal transfer plate 9 for longer than is actually necessary to bring the semiconductor wafer into thermal equilibrium with the active thermal transfer plate.

In contrast, in the present invention the controller 12 controls cooling of the semiconductor wafer by the active thermal transfer plate 9 based on the measurement performed by the IR sensor.

In particular, the controller 12 is configured to receive a measurement result from the IR sensor, and to control cooling of the semiconductor wafer by the active thermal transfer plate 9 based on the received measurement result.

In this embodiment, the controller 12 is configured to control a duration of cooling of the semiconductor wafer by the active thermal transfer plate 9 based on the measurement result of the IR sensor 10. In particular, the controller 12 is configured to control the duration of cooling of cooler semiconductor wafers (which will have a smaller measured IR magnitude) to be shorter than the duration of cooling of hotter semiconductor wafers (which will have a larger measured IR magnitude). Where the temperature of a semiconductor wafer is equal to, or within a predetermined range of, a desired temperature, for example the temperature of the weighing chamber 5, it may be decided to not cool the semiconductor wafer using the active thermal transfer plate. In other words, the duration of cooling of the semiconductor wafer by the active thermal transfer plate 9 may be controlled to be zero.

In this embodiment, the controller 12 is configured to categorise each incoming semiconductor wafer as either "cold" or "hot" based on the measurement result of the IR sensor 10, and to control a duration of cooling of the semiconductor wafer by the active thermal transfer plate 9 based on this categorisation.

Of course, in other embodiments the controller 12 may more generally be configured to categorise each incoming semiconductor wafer as either "ambient" or "non-ambient" based on the measurement result of the IR sensor 10.

For example, the magnitude of IR radiation measured by the IR sensor 10 for a semiconductor wafer may be compared to a predetermined threshold value to see if the magnitude is greater than (or greater than or equal to) the predetermined threshold value. When the magnitude is greater than (or greater than or equal to) the predetermined threshold value, the semiconductor wafer may be categorised as being "hot", and where this is not the case the semiconductor wafer may be categorised as being "cold".

Semiconductor wafers categorised as being "hot" may be cooled for a first duration, whereas semiconductor wafers categorises as being "cold" may be cooled for a shorter second duration, which may for example be zero (in other words the "cold" wafers may not be cooled by the active thermal transfer plate 9). For example, instead of all semiconductor wafers being cooled by the active thermal transfer plate 9 for a period of 40 seconds, "hot" wafers may be cooled for 40 seconds and "cold" wafers may be cooled for 30 seconds, for example. Thus, the total cooling time for cooling a mixture of "hot" and "cold" wafers is reduced, and a throughput and productivity is increased.

Of course, there may be more than two categories, and the hottest semiconductor wafers may be categorised in a third category that has a longer cooling time that the "hot" wafers, for example 50 seconds.

In this embodiment, the duration of cooling of the semiconductor wafer by the active thermal transfer plate 9 is controlled by controlling an amount of time that the semiconductor wafer is loaded onto the active thermal transfer plate. Thus, the controller 12 may control a time at which the semiconductor wafer is loaded onto the active thermal transfer plate 9 and a time at which the semiconductor wafer is unloaded from the active thermal transfer plate 9 so as to appropriately control the duration of cooling of the semiconductor wafer by the active thermal transfer plate 9. As mentioned above, the amount of time that the semiconductor wafer is loaded onto the active thermal transfer plate 9 may be controlled to be zero.

In other embodiments, the controller 12 may alternatively, or additionally, control an amount of active cooling of the active thermal transfer plate 9. For example, the controller 12 may control a power supplied to the Peltier devices 11, so as to change a rate of cooling provided by the Peltier devices.

In alternative embodiments, the cooling of the semiconductor wafer may be controlled uniquely based on the measurement result of the IR sensor 10, for example using a relationship that relates an IR measurement result by the IR sensor 10 with an appropriate duration of cooling of the semiconductor wafer. Such a relationship may be predetermined in advance by appropriate experimentation.

Alternatively, the semiconductor wafers may be categorised into more than two categories, for example by comparing the measurement output of the IR sensor 10 with a plurality of predetermined threshold values.

In an alternative embodiment, the IR sensor 10 and controller 12 may instead, or additionally, be provided for the passive thermal transfer plate 7. Thus, cooling of the semiconductor wafer by the passive thermal transfer plate 7 may be controlled by the controller 12 on the basis of a measurement by the IR sensor 10.

Figure 2:
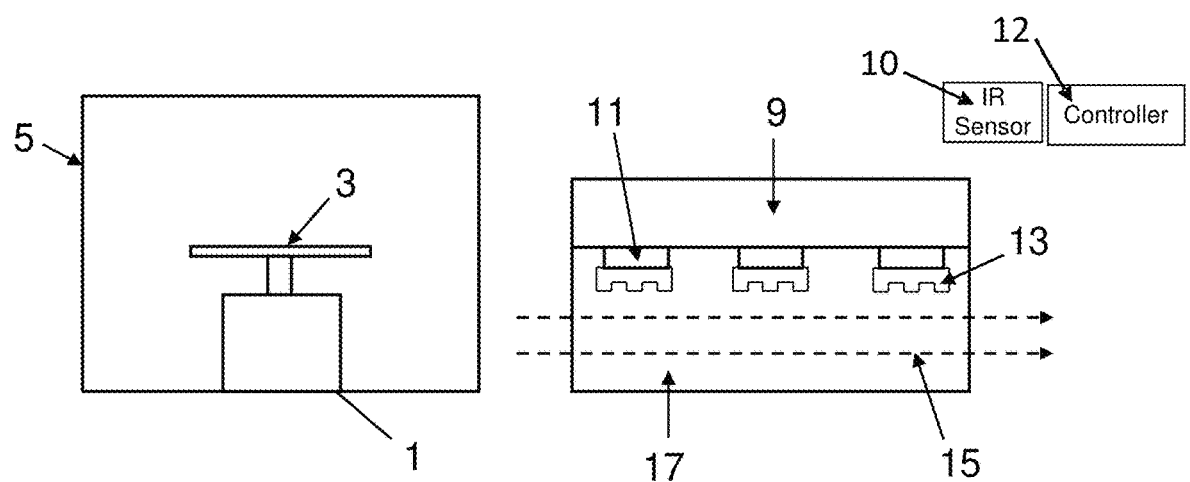
FIG. 2 shows a semiconductor wafer mass metrology apparatus according to a second embodiment of the present invention.

FIG. 2 shows a semiconductor wafer mass metrology apparatus according to a second embodiment. The semiconductor wafer mass metrology apparatus according to the second embodiment differs from the first embodiment in that the passive thermal transfer plate 7 of the first embodiment is omitted. The other features of this embodiment may otherwise be the same as those of the first embodiment discussed above, so these features are not described again in detail.

In the second embodiment, the semiconductor wafer may be transported directly to the weighing chamber 5 from the active thermal transfer plate 9.

In this embodiment, the active thermal transfer plate 9 is preferably controlled to substantially match the temperature of the semiconductor wafer to the temperature of the weighing chamber 5.

Figure 3:
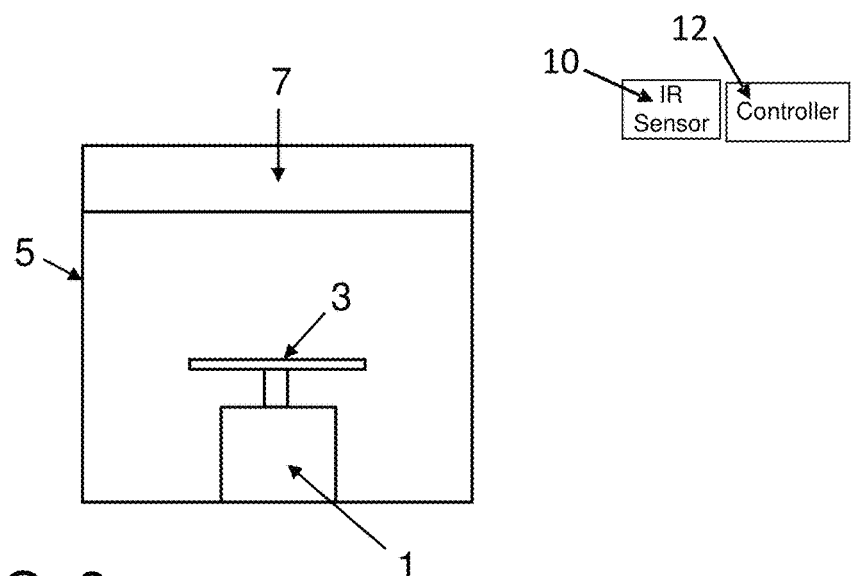
FIG. 3 shows a semiconductor wafer mass metrology apparatus according to a third embodiment of the present invention.

FIG. 3 shows a semiconductor wafer mass metrology apparatus according to a third embodiment. The semiconductor wafer mass metrology apparatus according to the third embodiment differs from the first embodiment in that the active thermal transfer plate 9 is omitted, and that the IR sensor 10 and controller 12 are instead provided for the passive thermal transfer plate 7.

Thus, in the third embodiment the IR sensor measures IR radiation from a semiconductor wafer before it is loaded onto the passive thermal transfer plate 7, which is indicative of an incoming temperature of the semiconductor wafer at the passive thermal transfer plate 7.

The controller 12 then controls a duration of cooling of the semiconductor wafer by the passive thermal transfer plate 7 in a similar manner to that discussed above in relation to the first embodiment, for example by controlling an amount of time that the semiconductor wafer is loaded onto the passive thermal transfer plate 7.

In an alternative embodiment, the passive thermal transfer plate 7 may not be positioned on the weighing chamber 5, and may instead be provided separately to the weighing chamber 5.

In the embodiments discussed above, the cooling of the semiconductor wafer is controlled based on an IR magnitude from the semiconductor wafer detected by the IR sensor 10.

In some cases, semiconductor wafers may have one or more coatings that can affect the IR magnitude emitted by the semiconductor wafer for a given temperature of the semiconductor wafer.

The present invention may therefore further comprise calibrating the IR sensor 10 and/or the controller 12 for the specific configuration of the semiconductor wafer, for example by taking into account the IR emissivity of any surface coatings of the semiconductor wafer.

For example, where the measurement result of the IR sensor 10 is compared to a predetermined threshold value so as to categorise the semiconductor wafer in a particular category, the predetermined threshold value may be determined taking into account the specific configuration of the semiconductor wafer being measured, for example any surface coatings of the semiconductor wafer.

Such a predetermined value can be determined experimentally by measuring IR signals from a semiconductor wafer having a particular configuration (e.g. particular surface coatings) for different temperatures of the semiconductor wafer. Alternatively, such a predetermined value may be calculated based on theory.

The above described embodiments relate to cooling the semiconductor wafer. However, in other embodiments the active and/or passive thermal transfer plate may instead be used to heat the semiconductor wafer.

Figure 4:
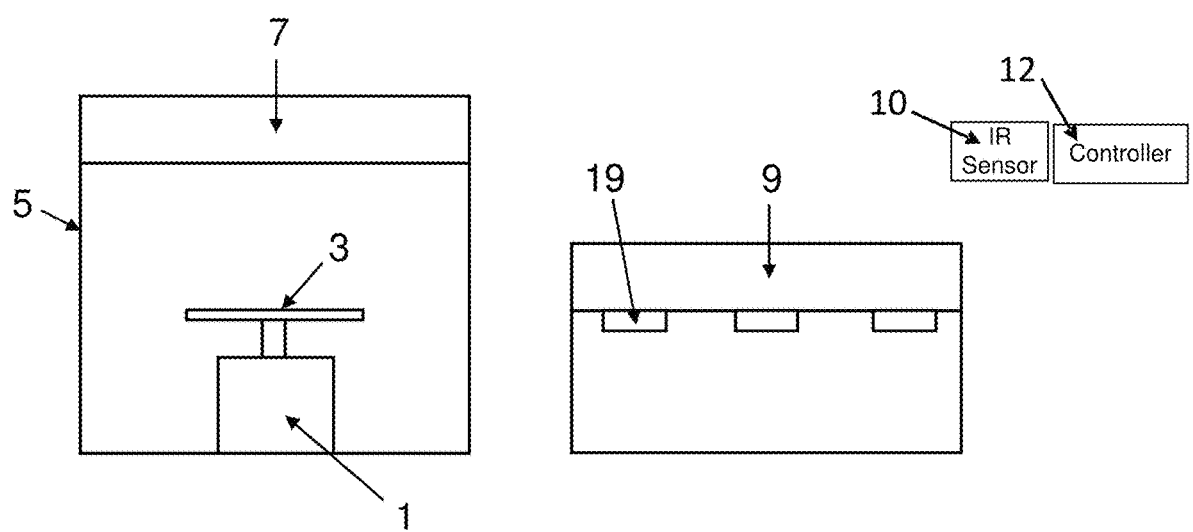
FIG. 4 shows a semiconductor wafer mass metrology apparatus according to another embodiment of the present invention.

The active and/or passive thermal transfer plate of the embodiments described above may be replaced with other types of cooling or heating devices (e.g. element 19 shown in FIG. 4).

The above embodiments relate to semiconductor wafer mass metrology, where the semiconductor wafer is loaded onto a weighing balance. However, other embodiments may relate to other types of metrology where the semiconductor wafer is loaded onto a different type of measurement area, or more generally to other types of semiconductor wafer processing, where the semiconductor wafer is loaded onto a processing area.

The invention claimed is:

1. A semiconductor wafer mass metrology method comprising:
controlling, via a controller, cooling or heating of a semiconductor wafer by:
detecting information relating to an incoming temperature of the semiconductor wafer, wherein the information relating to the incoming temperature of the semiconductor wafer is detected before starting cooling or heating of the semiconductor wafer when performing cooling or heating of the semiconductor wafer via a cooling or heating part;
comparing the detected information relating to the incoming temperature of the semiconductor wafer with a threshold value;
based on a result of the comparison,
categorising the semiconductor wafer into one of a plurality of categories; and
controlling cooling or heating of the semiconductor wafer based on a result of the categorisation;
wherein controlling the cooling or heating of the semiconductor wafer based on the result of the categorisation comprises setting a duration of the cooling or heating of the semiconductor wafer, or deciding not to perform the cooling or heating of the semiconductor wafer; and
subsequently loading the semiconductor wafer onto a measurement area of a semiconductor wafer mass metrology apparatus.

2. The method according to claim 1, wherein the information relating to the incoming temperature of the semiconductor wafer is detected using a non-contact measurement method.

3. The method according to claim 1, wherein detecting the information relating to the incoming temperature of the semiconductor wafer comprises detecting radiation emitted by the semiconductor wafer.

4. The method according to claim 1, wherein controlling the cooling or heating of the semiconductor wafer comprises controlling a rate of the cooling or heating of the semiconductor wafer.

5. The method according to claim 1, wherein the semiconductor wafer is cooled or heated using a powered cooling or heating device.

6. The method according to claim 5, wherein controlling the cooling or heating of the semiconductor wafer comprises controlling a power of the cooling or heating device.

7. The method according to claim 1, where controlling the cooling or heating of the semiconductor wafer comprises controlling a duration of the cooling or heating of the semiconductor wafer to be zero when the temperature of the semiconductor wafer is equal to, or within a predetermined range of, a predetermined temperature.

8. The method according to claim 1, wherein controlling the cooling or heating of the semiconductor wafer comprises skipping an available cooling or heating step if a temperature difference between a measured temperature of the semiconductor wafer and a predetermined temperature is less than +/−2° C., or +/−1° C., or +/−0.5° C., or +/−0.1° C.

9. The method according to claim 1, wherein:
The measurement area is inside a measurement chamber; and
the temperature of the semiconductor wafer is controlled to be substantially equal to the temperature of the measurement chamber, or within +/−2° C., or +/−1° C., or +/−0.5° C., or +/−0.1° C., of the temperature of the measurement chamber.

10. A semiconductor wafer mass metrology apparatus comprising:
a cooling or heating part for cooling or heating a semiconductor wafer;
a controller configured to control cooling or heating of the semiconductor wafer by the cooling or heating part based on detected information relating to an incoming temperature of the semiconductor wafer, wherein the information relating to the incoming temperature of the semiconductor wafer is detected before starting cooling or heating of the semiconductor wafer when performing cooling or heating of the semiconductor wafer; and wherein the controller is configured to:
compare the detected information relating to the incoming temperature of the semiconductor wafer with a threshold value;
based on a result of the comparison, categorise the semiconductor wafer into one of a plurality of categories; and
control the cooling or heating of the semiconductor wafer based on a result of the categorization; and
wherein, to control the cooling or heating of the semiconductor wafer by the cooling or heating part based on the result of the categorization, the controller is configured to set a duration of the cooling or heating of the semiconductor wafer by the cooling or heating part, or decide not to perform the cooling or heating of the semiconductor wafer by the cooling or heating part; and
a measurement area onto which the semiconductor wafer is subsequently loaded.

11. The apparatus according to claim 10, wherein the controller is configured to control a duration of time that the semiconductor wafer is in contact with the cooling or heating part.

12. The apparatus according to claim 10, wherein the controller is configured to control a rate of cooling or heating of the cooling or heating part.

13. The apparatus according to claim 10, wherein the cooling or heating part comprises a powered cooling or heating device.

14. The apparatus according to claim 13, wherein the controller is configured to control a power of the powered cooling or heating device.

15. The apparatus according to claim 10, where the controller is configured to control a duration of the cooling or heating of the semiconductor wafer to be zero when the temperature of the semiconductor wafer is equal to, or within a predetermined range of, a predetermined temperature.

16. The apparatus according to claim 10, wherein the controller is configured to skip an available cooling or heating step if a temperature difference between a measured temperature of the semiconductor wafer and a predetermined temperature is less than +2° C., or +1° C., or +0.5° C., or +0.1° C.

17. The apparatus according to claim 10, wherein the apparatus comprises a detector configured to detect the information relating to the incoming temperature of the semiconductor wafer.

18. The apparatus according to claim 17, wherein the detector comprises an infrared detector for detecting infrared radiation from the semiconductor wafer.

19. A system comprising:
the apparatus according to claim 10; and
a detector configured to detect the information relating to the incoming temperature of the semiconductor wafer.

20. The system according to claim 19, wherein the detector comprises an infrared detector for detecting infrared radiation from the semiconductor wafer.

* * * * *